US009279842B2

(12) United States Patent
Jensen et al.

(10) Patent No.: US 9,279,842 B2
(45) Date of Patent: Mar. 8, 2016

(54) ASSEMBLY AND A METHOD OF DETERMINING A CHANGE IN CAPACITANCE (71) Applicant: GN Store Nord A/S, Ballerup (DK)

(72) Inventors: Jakob Jensen, Hvidovre (DK); Peter Mossner, Kastrup (DK); Peter Schou Sørensen, Valby (DK); Kathrine Steen Urup, Valby (DK); Lars Klint Johansen, Valby (DK); Flemming Juul Raklev, Koege (DK); Thomas Vad, Lynge (DK)

(73) Assignee: GN Store Nord A/S, Ballerup (DK)

( * ) Notice: Subject to any disclaimer, the term of this patent is extended or adjusted under 35 U.S.C. 154(b) by 173 days.

(21) Appl. No.: 14/136,797

(22) Filed: Dec. 20, 2013

(65) Prior Publication Data

US 2014/0177862 A1    Jun. 26, 2014

(30) Foreign Application Priority Data

Dec. 20, 2012  (EP) .................................... 12198312

(51) Int. Cl.
| H04R 1/10 | (2006.01) |
| G01R 27/26 | (2006.01) |
| G01D 5/241 | (2006.01) |
| H03K 17/96 | (2006.01) |
| H04M 1/60 | (2006.01) |
| H03K 17/975 | (2006.01) |

(52) U.S. Cl.
CPC ............ *G01R 27/2605* (2013.01); *G01D 5/241* (2013.01); *H03K 17/962* (2013.01); *H03K 17/975* (2013.01); *H04M 1/6058* (2013.01); *H04R 1/1041* (2013.01)

(58) Field of Classification Search
None
See application file for complete search history.

(56) References Cited

U.S. PATENT DOCUMENTS

| 3,895,293 | A | 7/1975 | Munz |
| 5,159,316 | A * | 10/1992 | Lazzara ..................... 340/568.2 |
| 6,463,157 | B1 * | 10/2002 | May ............................... 381/151 |
| 7,250,773 | B2 | 7/2007 | Takekawa et al. |
| 2004/0196050 | A1 * | 10/2004 | Lurtz ............................ 324/525 |
| 2005/0077909 | A1 | 4/2005 | Lalla |
| 2007/0117445 | A1 | 5/2007 | Yamaura et al. |
| 2007/0131445 | A1 | 6/2007 | Gustavsson |
| 2007/0237170 | A1 | 10/2007 | Proctor et al. |

(Continued)

FOREIGN PATENT DOCUMENTS

| DE | 102007022039 A1 | 11/2008 |
| FR | 2627332 A3 | 8/1989 |
| GB | 542065 A | 12/1941 |
| JP | 2006194589 A | 7/2006 |

(Continued)

OTHER PUBLICATIONS

EP Search Report dated Sep. 30, 2013.

*Primary Examiner* — Thang Tran
(74) *Attorney, Agent, or Firm* — Harness, Dickey & Pierce, P.L.C.

(57) ABSTRACT

An assembly and a method for determining a change in capacitance in a cable, such as a change caused by a deformation of the cable. The deformation may be caused by a deforming element attached to the cable and slideable along the cable. The deforming element may be adapted to be compressed by a user and convert the compression force into a compression of the cable so as to cause the capacitance change. The assembly may form part of a headset and the deformation may be used to control a media player or mobile telephone used with the headset.

10 Claims, 5 Drawing Sheets

(56) References Cited

U.S. PATENT DOCUMENTS

2010/0211353 A1* 8/2010 Volckers .................. 702/158
2011/0037483 A1 2/2011 Scheuermann et al.

FOREIGN PATENT DOCUMENTS

| | | |
|---|---|---|
| JP | 2008130366 A | 6/2008 |
| WO | WO-2008135040 A2 | 11/2008 |

* cited by examiner

ASSEMBLY AND A METHOD OF DETERMINING A CHANGE IN CAPACITANCE

CROSS-REFERENCE TO RELATED APPLICATIONS

This application claims priority to European Patent Application No. EP12198312.6 which has an International filing date of Dec. 20, 2012, the entire contents of which are incorporated herein by reference.

BACKGROUND (1) Field

The present invention relates to an assembly comprising a sensor configured to determine a change in capacitance in a cable and a method of determining a change in capacitance in a cable.

(2) Description of Related Art

A change in capacitance of a cable may be brought about by deforming the cable or e.g. another capacitance touching the cable. This deformation or touch may be used for e.g. controlling electronics connected to the cable, such as a media player or mobile telephone feeding signals through the cable to e.g. a headset.

Capacitance sensors may be seen in e.g. U.S. Pat. No. 3,895,293, U.S. Pat. No. 7,250,773 and US 2005/0077909.

SUMMARY

A first aspect of the invention relates to an assembly comprising:
  a cable comprising at least two elongate, co-extending electrical conductors,
  a sensor configured to determine a change in capacitance between a first and a second of the conductors and output a corresponding electrical signal, and
  a deforming element attached to the cable so as to be translatable along the cable,
the deforming element comprising:
  engaging elements configured to engage with the cable,
  a deforming part,
  an energy storage configured to provide energy to the deforming part, the deforming part being configured to convert at least part of the provided energy into a temporary deformation of the cable, and
  an activator configured to receive a force and activate the deforming part, when the received force exceeds a threshold force.

Preferably, the sensor is electrically, such as galvanically, connected at least to the first and second conductors. Naturally, more than two conductors may be used in the determination or sensing.

In this context, the conductors are co-extending if they all extend along a longitudinal axis of the cable. Usually, the conductors are positioned, in relation to each other, at the same relative position throughout a length of the cable, such that a cross section of the cable in a plane perpendicular to the longitudinal axis of the cable, is the same throughout at least a part of the cable.

In one embodiment, one conductor encircles, in the plane, another of the conductors so as to be a co-axial cable. In other embodiments, the conductors are positioned beside each other. Some cables have twisted conductors or are twisted cables, and combinations exist, such as one in which multiple conductors positioned beside each other are provided inside tube-shaped conductor.

In this respect, the capacitance is the ability to store a charge. A charge may be stored between two conductors, be it capacitor plates or conductors of any shape. The capacitance may be changed in a number of manners, such as by varying a distance there between and/or by varying the permittivity of a material positioned between the conductors. Thus, a deformation of the cable will cause a change in the capacitance.

Naturally, any change of the capacitance may be determined. The change may be an absolute change, such as a predetermined minimum capacitance value determined during a maximum period of time, such as at least 0.1 pF, such as at least 0.2 pF, such as at least 0.3 pF, such as at least 0.4 pF, such as at least 0.5 pF, such as at least 0.6 pF, such as at least 0.7 pF, such as at least 0.8 pF, such as at least 0.9 pF, such as at least 1 pF, such as at least 1.1 pF, such as at least 1.2 pF, such as at least 1.3 pF, such as at least 1.4 pF, such as at least 1.5 pF, such as at least 1.6 pF, such as at least 1.7 pF, such as at least 1.8 pF, such as at least 1.9 pF, such as at least 2 pF, such as at least 3 pF, such as at least 4 pF, such as at least 5 pF, such as at least 6 pF, such as at least 7 pF, such as at least 8 pF, such as at least 9 pF, such as at least 10 pF, such as at least 15 pF, such as at least 20 pF, such as at least 25 pF, such as at least 30 pF, such as at least 40 pF, such as at least 50 pF, such as at least 70 pF, such as at least 80 pF, such as at least 90 pF, such as at least 100 pF. A maximum time period during which the minimum capacitance change is determined may be no more than 1 ms, such as no more than 2 ms, such as no more than 3 ms, such as no more than 4 ms, such as no more than 5 ms, such as no more than 6 ms, such as no more than 7 ms, such as no more than 8 ms, such as no more than 9 ms, such as no more than 10 ms, such as no more than 11 ms, such as no more than 12 ms, such as no more than 13 ms, such as no more than 14 ms, such as no more than 15 ms, such as no more than 16 ms, such as no more than 17 ms, such as no more than 18 ms, such as no more than 19 ms, such as no more than 20 ms, such as no more than 21 ms, such as no more than 22 ms, such as no more than 23 ms, such as no more than 24 ms, such as no more than 25 ms, such as no more than 26 ms, such as no more than 27 ms, such as no more than 28 ms, such as no more than 29 ms, such as no more than 30 ms, such as no more than 31 ms, such as no more than 32 ms, such as no more than 33 ms, such as no more than 34 ms, such as no more than 35 ms, such as no more than 36 ms, such as no more than 37 ms, such as no more than 38 ms, such as no more than 39 ms, such as no more than 40 ms, such as no more than 45 ms, such as no more than 50 ms, such as no more than 55 ms, such as no more than 60 ms, such as no more than 65 ms, such as no more than 70 ms, such as no more than 80 ms, such as no more than 90 ms, such as no more than 100 ms, such as no more than 110 ms, such as no more than 120 ms, such as no more than 130 ms, such as no more than 140 ms, such as no more than 150 ms, such as no more than 175 ms, such as no more than 200 ms, such as no more than 250 ms, such as no more than 300 ms, such as no more than 400 ms, such as no more than 450 ms, such as no more than 500 ms, such as no more than 600 ms, such as no more than 700 ms, such as no more than 800 ms, such as no more than 900 ms, such as no more than 1000 ms.

Alternatively, or in addition, the change may be a relative change, such as a change of at least 0.1%, such as at least 0.3%, such as at least 0.5%, such as at least 0.6%, such as at least 0.7%, such as at least 0.9%, such as at least 1%, such as at least 1.1%, such as at least 1.3%, such as at least 1.5%, such as at least 1.6%, such as at least 1.7%, such as at least 1.9%, such as at least 2%, such as at least 2.5%, such as at least 3%, such as at least 3.5%, such as at least 4%, such as at least 5%, such as at least 7.5%, such as at least 10%, such as at least 15%, such as at least 20%, such as at least 25%, such as at least 30%, such as at least 40%, such as at least 50%, such as at least 75%, such as at least 100%, such as at least 125%, such as at least 150%, such as at least 200%, such as at least 250%, such as at least 300%, such as at least 400%.

The corresponding electrical signal may be a signal from which it may be determined that the change has taken place. Alternatively, the signal may be of a type from which more information may be derived, such as an amount or a magnitude of the change determined. Alternatively, or additionally, the signal may comprise therein information relating to a type of change, such as a swift change, a slow change, a change within a first time interval, a change within a second time interval being different from the first time interval, a reduction of the capacitance, an increase of the capacitance, or the like.

As will be described below, the change may be determined only if complying with certain requirements such as that it must take place within a predetermined time period and/or must have a certain magnitude and/or variation (rate of change or the like). Such information may thus be inferred from the corresponding signal, such as from the very existence thereof.

The corresponding signal is output on one or more of the conductors of the cable. These conductors may be the same as those in relation to which the sensor determines the capacitance change or not. In this manner, the sensor may be positioned anywhere on the cable, such as at an end thereof, and a circuit receiving the corresponding signal and acts on it may also be provided at any position along the cable or may be connected to the cable at any position thereof.

The deformation may be a compression, a bending, a twisting, an extending/prolongation or the like—or any combination thereof.

Preferably, the deformation may be a compression of 0.3% or more, such as 0.5% or more, such as 0.7% or more, such as 0.8% or more, such as 1% or more, such as 1.2% or more, such as 1.4% or more, such as 1.6% or more, such as 1.8% or more, such as 2% or more, such as 2.2% or more, such as 2.4% or more, such as 2.6% or more, such as 2.8% or more, such as 3% or more, such as 3.2% or more, such as 3.4% or more, such as 3.6% or more, such as 3.8% or more, such as 4% or more, such as 5% or more, such as 6% or more, such as 7% or more, such as 8% or more, such as 9% or more, such as 10% or more, such as 15% or more, such as 20% or more, such as 30% or more, such as 40% or more, such as 50% or more.

An extension may be an extension of 0.3% or more, such as 0.5% or more, such as 0.7% or more, such as 0.8% or more, such as 1% or more, such as 1.2% or more, such as 1.4% or more, such as 1.6% or more, such as 1.8% or more, such as 2% or more, such as 2.2% or more, such as 2.4% or more, such as 2.6% or more, such as 2.8% or more, such as 3% or more, such as 3.2% or more, such as 3.4% or more, such as 3.6% or more, such as 3.8% or more, such as 4% or more, such as 5% or more, such as 6% or more, such as 7% or more, such as 8% or more, such as 9% or more, such as 10% or more, such as 15% or more, such as 20% or more, such as 30% or more, such as 40% or more, such as 50% or more.

A bending may be a bending of 1° or more, such as 2° or more, such as 3° or more, such as 4° or more, such as 5° of more, such as 6° or more, such as 7° or more, such as 8° or more, such as 9° or more, such as 10° or more, such as 11° or more, such as 12° or more, such as 13° or more, such as 14° or more, such as 51° of more, such as 16° or more, such as 17° or more, such as 18° or more, such as 19° or more, such as 20° or more, such as 25° or more, such as 30° or more, such as 40° or more, such as 50° or more, such as 60° of more, such as 70° or more, such as 80° or more, such as 90° of more, such as 100° or more, such as 120° or more, such as 140° or more, such as 160° or more, such as 180° or more.

A twisting may be a twisting of the cable of 1° or more, such as 2° or more, such as 3° or more, such as 4° or more, such as 5° of more, such as 6° or more, such as 7° or more, such as 8° or more, such as 9° or more, such as 10° or more, such as 11° or more, such as 12° or more, such as 13° or more, such as 14° or more, such as 51° of more, such as 16° or more, such as 17° or more, such as 18° or more, such as 19° or more, such as 20° or more, such as 25° or more, such as 30° or more, such as 40° or more, such as 50° or more, such as 60° of more, such as 70° or more, such as 80° or more, such as 90° or more, such as 100° or more, such as 120° or more, such as 140° or more, such as 160° or more, such as 180° or more.

During the deformation, a distance between the conductors may change. This change, compared the distance there between in the non-deformed state may be 0.3% or more, such as 0.5% or more, such as 0.7% or more, such as 0.8% or more, such as 1% or more, such as 1.2% or more, such as 1.4% or more, such as 1.6% or more, such as 1.8% or more, such as 2% or more, such as 2.2% or more, such as 2.4% or more, such as 2.6% or more, such as 2.8% or more, such as 3% or more, such as 3.2% or more, such as 3.4% or more, such as 3.6% or more, such as 3.8% or more, such as 4% or more, such as 5% or more, such as 6% or more, such as 7% or more, such as 8% or more, such as 9% or more, such as 10% or more, such as 15% or more, such as 20% or more, such as 30% or more, such as 40% or more, such as 50% or more.

In one situation, the deformation is local, whereby the deformation is performed over a length of the cable of no more than 20 mm, such as no more than 18 mm, such as no more than 16 mm, such as no more than 14 mm, such as no more than 12 mm, such as no more than 10 mm, such as no more than 8 mm, such as no more than 6 mm, such as no more than 4 mm, such as no more than 2 mm, such as no more than 1 mm, such as no more than 0.5 mm.

Preferably, the deformation is temporary, reversible and/or elastic, so that the cable can, after deformation, revert to its original shape and/or capacitance, or at least within a few percent thereof.

In general, the deforming element is preferably attached to the cable so as to be translatable along the cable. The attachment may be designed to ensure that the deforming element and cable are not accidentally attached. In one situation, the deforming element has therein a channel or opening through which the cable extends. In another situation, the deforming means may comprise a hook or the like for engaging the cable.

In a preferred embodiment, the deforming element is configured to receive a force and direct at least part of the received force to the cable, when the received force exceeds a threshold force.

The force may be received from a user or from a force exerting element, such as a spring, a motor, an actuator or the like. The force received may be received from a depression, rotation or the like of an element of the deforming element. In one situation, the deforming element comprises an engagement element for engagement by a user by depression and/or rotation thereof.

When the force exceeds a threshold force, at least a part of the force is directed to the cable. The threshold force may be used to ensure that a sufficient force is available to provide a sufficient deformation of the cable. The at least part of the force may be equal to or lower than the threshold force. When a sufficient force is available, it may be desired or ensured that the force exerted to the cable is reproducible or identical, so that the deformation generated is the same, identical or reproducible.

The force received may be applied directly to the cable or may be collected or stored in a force or energy storage and provided later on, if desired. Force/energy storages may be a battery, a capacitor, or a mechanical store, such as a resilient/deformable element, a rubber element, a spring (coil spring, leaf spring or the like), or the like. The mechanical store may be deformed to store energy and which may release at least part of the stored energy by moving back toward a rest position or an un-deformed shape thereof.

Naturally, this element may be provided electronically, where the force received is detected or determined and a deforming part is driven toward the cable, when the force received is sufficient. In this manner, the force received may be quantified and the deforming part operated when it is certain that the force received is not accidental. In that respect, the force applied to the cable may be higher than that received.

In another situation, the force exerted is used to deform the cable. The force received may be applied directly to the cable or may be stored, such as in a spring. The determination of whether the force exceeds the threshold force may be mechanical, such as a deformation or translation/rotation of an element requiring deformation/translation/rotation in order to allow the force received to reach the cable. Thus, as long as this threshold force is not received, the element is not sufficiently deformed/translated/rotated, and no force is applied to the cable.

In one embodiment, the exertion of the force may be predetermined also over time so that no matter over how long a period of time, the force received takes to build up to a value at or exceeding the threshold force, the force exerted to the cable may be well-defined in time and magnitude.

In one situation, the deforming element is configured to perform a predetermined minimum deformation, such as a depression depth, twisting angle, bending angle, extension or the like, within a predetermined maximum period of time, such as 1000 ms or less, such as 900, 800, 600, 500, 300, 200 100, 50, 25 ms or less, and wherein the sensor is configured to output the corresponding signal if a predetermined capacitance change is sensed within the predetermined maximum period of time.

In this situation, the deforming element and the sensor are adapted to each other so that the sensor is especially suited for sensing or deforming capacitance changes as those brought about by the deforming element.

The deformation may be sensed as a particular deformation within the period of time, or the deformation may be determined by e.g. a rate of change of the capacitance. When the deformation takes place within a small period of time, the rate of change increases, and such fast variations may be easily sensed. Thus, the sensor may be programmed or configured to determine variations only with rates of change exceeding a given value.

In one embodiment, the cable has a first and a second end, the assembly further comprising a transducer configured to convert an acoustic signal to an electric signal or convert an electric signal to an acoustic signal, the transducer being connected to one or more of the conductors at the first end of the cable.

The transducer may be a microphone or a loudspeaker, and the assembly may be a headset, for example.

In this situation, the sensor may be provided at the first end, which has the advantage that the other end of the cable may be terminated in a plug for attachment to other types of equipment.

In one embodiment of this type, the transducer is a sound generator configured to convert an electric signal into sound, the assembly further comprising a signal provider, such as a media player and/or a mobile telephone, connected to the one or more conductors at the second end of the cable, the signal provider being configured to receive and act on signals received from the sensor via the electrical conductors.

The acting on the signals received from the sensor may be the functions usually seen in headsets with buttons or the like. Thus, the signal provider may turn a volume up or down, may alter a music source, may take or end a call, or the like. Thus, the sensor may feed the signals that usual buttons on headsets or provided along cables may do.

In general, as is also described above, the cable may comprise at least three conductors of which one conductor, in a cross section perpendicular to a longitudinal axis of the cable, encircles two other of the at least three conductors, where the sensor is configured to determine a change in capacitance between the two other conductors and the one conductor. This has the advantage that any noise generated by the deformation will be common mode noise.

The activator may be a push button or rotatable element which may be configured to activate the deforming part. In some embodiments, the push button or rotatable element is used to provide energy (force, torque, work or the like) to the energy store, such as to deform an element. In other situations, the activator may be used to simply provide a signal, such as an electrical signal, activating the deforming part. In that situation, the activator may also be a touch pad/display, a voice activated element, an acceleration sensor or the like.

The deforming part may be configured to perform any type of deformation, such as a compression, an extension, a bending and/or a twisting of the cable. The deforming part preferably is configured to perform the deformation along a well-defined length of the cable.

The deforming part is preferably configured to perform the deformation within a predetermined period of time and/or with other predetermined parameters, such as with a predetermined magnitude or quantity of the deformation. As described above, the sensor may be adapted to recognize a particular type or magnitude/quantity of the deformation caused by the deforming part.

In one embodiment, the energy storage is a resilient element, activator is an element configured to receive energy from a user and compress the resilient element, and wherein the deforming part is a part configured to be moved by the resilient element in a direction toward the cable.

Another aspect of the invention relates to a method of determining a change in capacitance, the method comprising:
providing a cable comprising at least two elongate, co-extending electrical conductors,
providing a sensor,
attaching a deforming element to the cable, the deforming element comprising an activator, a deforming part and an energy storage,
the activator receiving a force,
if the received force exceeds a threshold force, activating the deforming part to receive energy from the energy storage and convert at least part of the received energy into a temporary deformation of the cable,
if the received force does not exceed the threshold force, not activating the deforming part, the sensor determining a change in capacitance between a first and a second of the conductors and outputting a corresponding electrical signal.

The change in capacitance may be caused by a user, such as by touching the cable or by deforming the cable.

As mentioned above, the co-extending conductors typically extend in the same relationship along the length of the cable.

The change may have any magnitude, and the sensor may transmit the signal along the same conductors between which the change occurs.

This deforming element may provide any type of deformation and preferably does so at a predetermined length of the cable and in a manner so that the deformation is reversible.

In general, the deforming element may be translated along the cable while being attached to the cable, at least when not deforming the cable. In this manner, the deforming element may be positioned where desired. The desired position may depend on the use situation, and it is an advantage that this position may be changed.

In one embodiment, the deforming step comprises the deforming element receiving a force/torque/work, such as from a compression, rotation or the like, and directs at least part of the received force/work/torque to the cable, so as to deform (e.g. bend, compress, extend and/or twist the cable), when the received force exceeds a threshold force.

the advantage of the threshold force is that the force available for the deformation may be sufficient to ensure a sufficient deformation of the cable.

In one situation, the deforming step comprises the deforming element performing at least a predetermined minimum deformation, such as a bending/twisting angle, compression depth, extension percentage, within a predetermined maximum period of time, and wherein the step of the sensor determining the change in capacitance comprises the sensor outputting the corresponding signal if a predetermined capacitance change is sensed within the predetermined maximum period of time.

The deformation may define an amplitude of the signal, where as the time may define a rate of change of the signal. The sensor may be configured to detect any of the amplitude and/or the rate of change, for example.

In one situation, the cable has a first and a second end, the method further comprising the step of providing a transducer connected to one or more of the conductors at the first end of the cable.

In one situation, the transducer is a sound generator, the method comprising the steps of:
 a signal provider, such as a media player and/or a mobile telephone, feeding an electric signal to the one or more conductors and the transducer receiving the signal and outputting a sound, and
 the signal provider receiving and act on signals received from the sensor via the electrical conductors.

In one situation, the cable comprises at least three conductors of which one conductor, in a cross section perpendicular to a longitudinal axis of the cable, encircles two other of the at least three conductors, where the step of the sensor determining the change in capacitance comprises the sensor is determining a change in capacitance between the two other conductors and the one conductor.

BRIEF DESCRIPTION OF DRAWINGS

In the following, preferred embodiments of the invention will be described with reference to the drawing, wherein.

DETAILED DESCRIPTION

Figure 1:
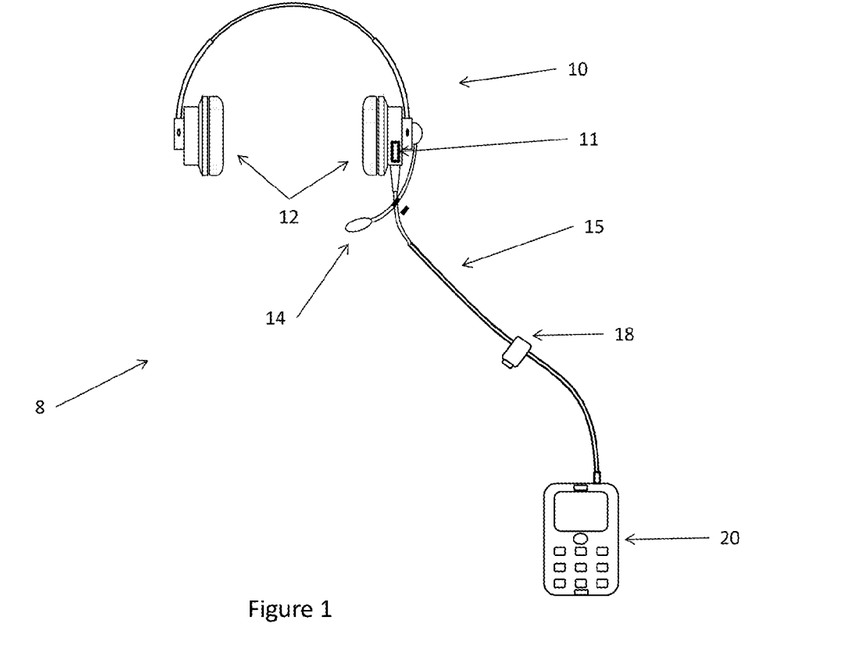
FIG. 1 illustrates a first embodiment according to the invention.

In FIG. 1, an assembly 8 is seen comprising a headset 10, a media player or mobile telephone 20 and a cable 15 there between, where a deforming element 18 is provided on the cable 15.

The headset comprises loudspeakers 12 and a microphone 14 as well as a processor 11.

As usual, signals from the media player or mobile telephone 20 may be provided to the loudspeakers 12 via the cable 15, and signals may be provided from the microphone 14 to the mobile telephone 20 via the cable 15.

The deforming element 18 may be used for controlling the operation of the mobile telephone as usual in the art, such as to take or end a call. Additionally or optionally, the deforming element 18 may be used for controlling other parameters, such as a volume of sound generated by the loudspeakers 12, an intensity of a signal from the microphone 14, the selection or de-selection or changing of media information, such as songs, provided by the media player or telephone 20.

Figure 2:
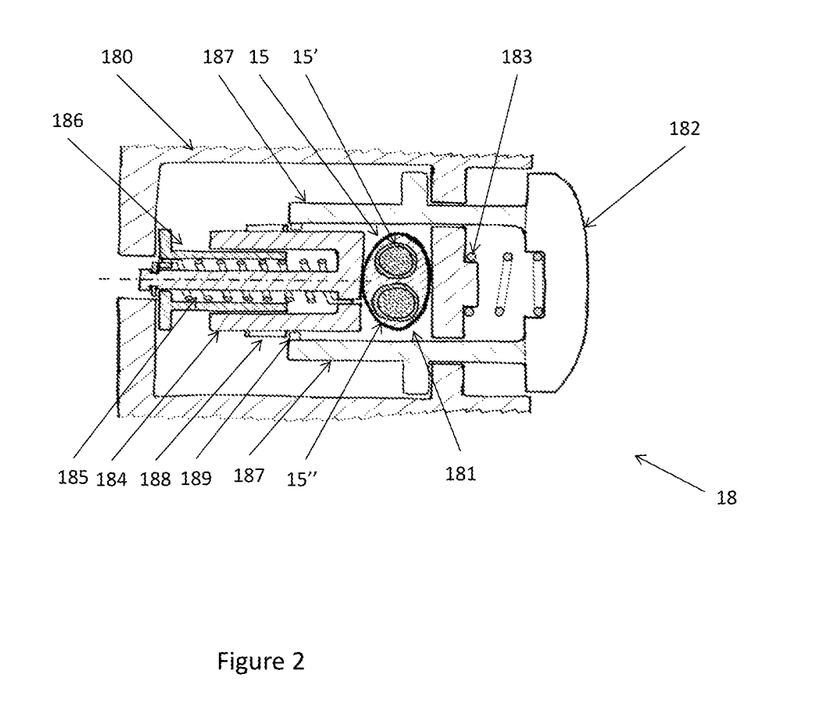
FIG. 2 illustrates a preferred embodiment of a deforming element at a first point in time.

In FIG. 2, the deforming element 18 is seen in a cross section. It is seen that the cable 15, having conductors 15' and 15", extends through a channel 181 defined in a housing 180 of the deforming element 18, which also has a push button 182, which is biased outwardly (to the right in the figure) by a biasing spring 183.

Inside the housing 180, a piston 184 is provided which is biased toward the cable 15 by a coil spring 185 provided inside the piston 184 and which is guided by a guide 186.

The piston 184 engages extended portions 187 of the push button 182, so that when pushing the push button 182 toward the housing 180 (to the left in the drawing), the biasing spring 183 will be compressed, as will the coil spring 185. When the force exerted to the push button 182 exceeds a threshold force, the engagement between the extended portions 187 and the piston 184 will be released, whereby the coil spring 185 will force the piston 184 toward the cable 15 and will exert an abrupt force on to the cable 15, briefly deforming the cable 15.

This deformation of the cable may be determined by determining or sensing a change in capacitance of the cable 15 or rather between conductors of the cable 15. As is usual in cables, the cable 15 will comprise a plurality, often 2, 3, 4, 5, 6 or 8 conductors, but more may be provided if desired. A deformation of the cable 15 will cause the distance between conductors, such as neighbouring conductors in the cable 15 to change, which will bring about a change in capacitance. This will be the case whether the conductors are co-pending and positioned beside each other as illustrated in FIG. 2, or if the conductors are co-axial where one surrounds one or more other conductors.

The processor 11 thus is configured to determine changes in capacitance of two or more of the conductors of the cable 15 and will output a signal either to the effect that a sufficient capacitance change has been sensed or a signal corresponding to the change sensed, such as a signal from which a quantification of the capacitance change may be determined or derived.

Capacitance change sensors is a thoroughly investigated field, and a wide variety of different types of sensors exists. Examples of capacitance sensors may be seen in e.g. U.S. Pat. No. 3,895,293, U.S. Pat. No. 7,250,773 and US 2005/0077909.

The overall operation of the deforming element 18 thus simply is to perform a brief and/or temporary deformation of the cable 15. The manner in which the presently described and preferred deforming element 18 operates is to provide a brief compression force to the cable 15. Naturally, other types of deformation, such as a bending, twisting or the like, may also be used.

The operation of the engagement between the extended portions 187 and the piston 184 act to contract the coil spring 185 to a predetermined degree for the coil spring to store sufficient energy to generate a sufficient deformation of the cable 15. This interaction may be provided in a number of manners, such as by simple friction.

Figure 3:
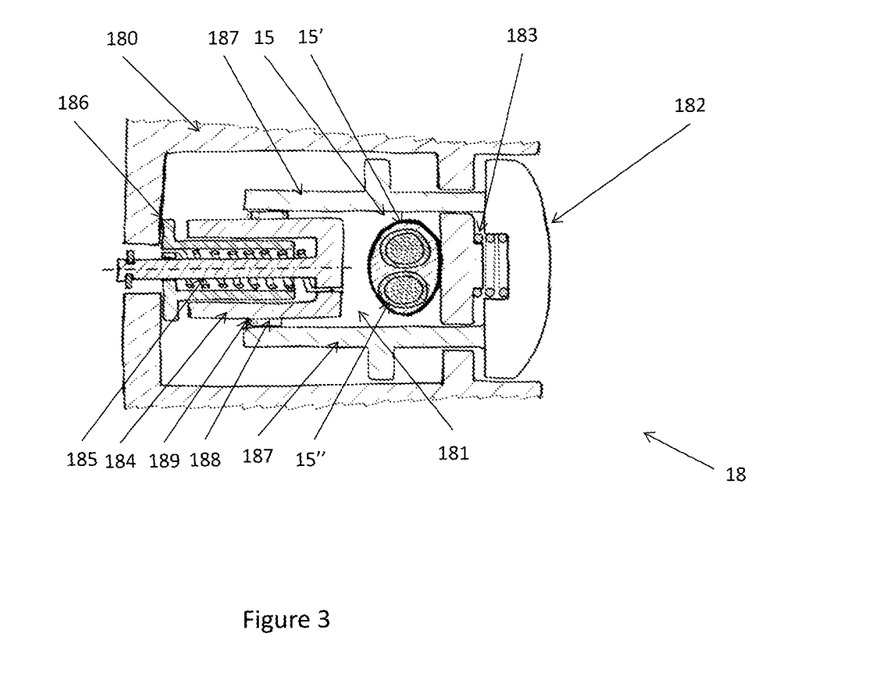
FIG. 3 illustrates the deforming element of FIG. 2 at a second point in time.

In FIG. 3, the deforming element 18 is seen where the push button 182 is pushed 95% of the way to the bottom, whereby the coil spring 185 stores practically all of the energy required.

Figure 4:
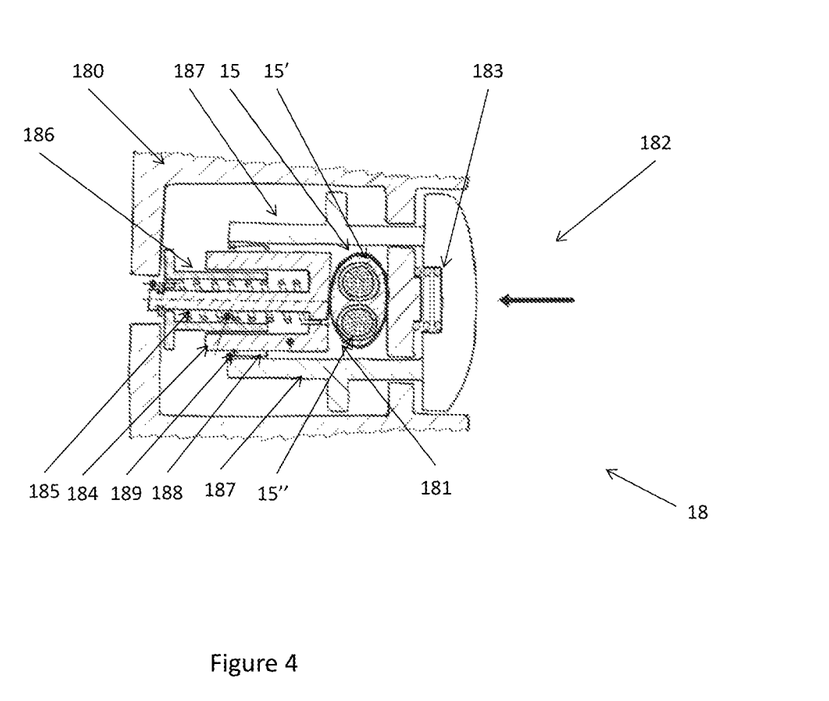
FIG. 4 illustrates the deforming element of FIG. 2 at a third point in time.

In FIG. 4, the extended portions 187 have disengaged the piston 184, which then has been forced toward the cable 15 by the action of the released coil spring 185.

In the preferred embodiment, the engagement between the extended portions 187 and the piston 184 is one in which the outer portions of the piston 184 have an outer thread 188 which is engaged by protrusions 189 of the extended portions. The operation of the engagement between the thread 188 and the protrusions 189 is that when the push button 182 is depressed while being prevented from rotating, the extended portions 187 will be forced to the left in the drawing, rotating the piston 184. This rotation will be counteracted by the coil spring 185, but the result of the depression of the push button 182 is that the piston 184 is depressed and rotated and that the coil spring 185 is compressed.

The angle and circumferential extent of the thread of course may be adapted to the force desired, the spring constant of the coil spring 185 and the like.

Figure 5:
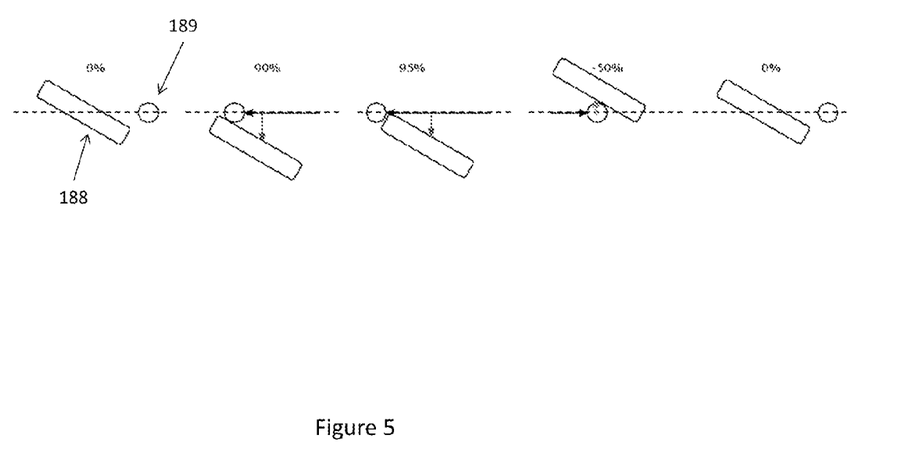
FIG. 5 illustrates the operation of a rotation rib segment of the deforming element of FIG. 2.

In FIG. 5, the engagement between the thread 188 and the protrusions 189 may be seen.

At 0% depression, the left illustration, of the push button 182, the protrusions 189 and the thread 188 do not, necessarily, engage. At 90% depression, the protrusion will have deflected the thread, by rotation of the piston 184, an angle illustrated by the vector in the second illustration.

At 95% depression, the protrusion 189 will almost release the thread 188, and it is seen that if the push button is depressed further, the protrusion will release the thread 188 which will return to the position of the first illustration while releasing the coil spring 185 and thus cause the deformation of the cable 15.

Upon release of the push button, the biasing spring 183 will act to pull the protrusions 189 to the right, thereby engaging the thread 188 and rotate the piston 184 in the other direction, until the protrusions 189 disengage the thread 188 to again return to the initial position illustrated in the first and last illustrations.

Naturally, the operation of the deforming element may be different. In some situations, the cable may instead be twisted, bent, extended or the like.

The spring(s) may be replaced by other resilient elements, such as rubber, foams, or the like.

Also, the deforming element or other element performing the deformation may be manually operated as described with reference to FIGS. 2-5 or may be operated using electronic means, such as a controllable operator performing the deformation, if desired.

In one embodiment, the sensor and the operation of the deforming element or other deforming apparatus may be adapted to each other, so that the sensor is sensitive to the capacitance change brought about by the deformation caused by the deforming element.

An advantage of the present deforming element is the repeatability of the deformation and thereby the capacitance change caused. In this manner, the sensor may be configured to "look for" capacitance changes of that type. In a preferred embodiment, the sensor is configured to detect capacitance changes having a minimum rate of change and/or an overall maximum time duration. In that manner, other deformations of the cable may not trigger the sensor.

It is noted that the cable may be deformed in a number of manners during use, such as when wearing the assembly of FIG. 1 while walking, running or the like.

Capacitance changes may also be caused by other effects than deforming the cable 15. One manner of changing the capacitance of a cable is to have another capacitance touch the cable, such as a hand of a user. Naturally, it may be desired to differ between intended and unintended engagements with the cable, so it may be desired to again have the sensor act only when the rate of change is within predetermined limits, the engagement is within a predetermined time limit or the engagement comprises a number of engagements with a given time pattern or other recognizable features which the sensor may act on and which are not or rarely seen during "usual" use.

What is claimed is:

1. An assembly comprising:
   a cable comprising at least two elongate, co-extending electrical conductors,
   a sensor configured to determine a change in capacitance between a first and a second of the conductors and output a corresponding electrical signal, and
   a deforming element attached to the cable so as to be translatable along the cable,
the deforming element comprising:
   engaging elements configured to engage with the cable,
   a deforming part,
   an energy storage configured to provide energy to the deforming part, the deforming part being configured to convert at least part of the provided energy into a temporary deformation of the cable, and
   an activator configured to receive a force and activate the deforming part, when the received force exceeds a threshold force.

2. An assembly according to claim 1, wherein:
   the energy storage is a resilient element,
   the activator is an element configured to receive the energy from a user and compress the resilient element, and
   the deforming part is a part configured to be moved by the resilient element in a direction toward the cable.

3. An assembly according to claim 1, wherein the deforming element is configured to perform a predetermined minimum deformation within a predetermined maximum period of time, and wherein the sensor is configured to output the corresponding signal if a predetermined capacitance change is sensed within the predetermined maximum period of time.

4. An assembly according to claim 1, wherein the cable has a first and a second end, the assembly further comprising a transducer configured to convert an acoustic signal to an electric signal or convert an electric signal to an acoustic signal, the transducer being connected to one or more of the conductors at the first end of the cable.

5. An assembly according to claim 4, wherein the transducer is a sound generator configured to convert an electric signal into sound, the assembly further comprising a signal provider connected to the one or more conductors at the second end of the cable, the signal provider being configured to receive and act on signals received from the sensor via the electrical conductors.

6. An assembly according to claim 1, wherein the cable comprises at least three conductors of which one conductor, in a cross section perpendicular to a longitudinal axis of the cable, encircles two other of the at least three conductors, where the sensor is configured to determine a change in capacitance between the two other conductors and the one conductor.

7. An assembly according to claim 1, wherein the sensor is configured to output the corresponding electrical signal on one or more of the conductors of the cable.

8. A method of determining a change in capacitance, the method comprising:
providing a cable comprising at least two elongate, co-extending electrical conductors,
providing a sensor,
attaching a deforming element to the cable, the deforming element comprising an activator, a deforming part and an energy storage,
the activator receiving a force,
if the received force exceeds a threshold force, activating the deforming part to receive energy from the energy storage and convert at least part of the received energy into a temporary deformation of the cable,
if the received force does not exceed the threshold force, not activating the deforming part,
the sensor determining a change in capacitance between a first and a second of the conductors and outputting a corresponding electrical signal.

9. A method according claim 8, wherein the cable comprises at least three conductors of which one conductor, in a cross section perpendicular to a longitudinal axis of the cable, encircles two other of the at least three conductors, where the step of the sensor determining the change in capacitance comprises the sensor is determining a change in capacitance between the two other conductors and the one conductor.

10. A method according to claim 8, wherein the sensor outputs the corresponding electrical signal on the one or more of the conductors of the cable.

* * * * *